US007943934B2

(12) United States Patent
Yoon et al.

(10) Patent No.: US 7,943,934 B2
(45) Date of Patent: May 17, 2011

(54) THIN FILM TRANSISTOR ARRAY PANEL AND METHOD FOR MANUFACTURING THE SAME

(75) Inventors: Young-Soo Yoon, Suwon-si (KR); Chong-Chul Chai, Seoul (KR); Joon-Chul Goh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 268 days.

(21) Appl. No.: 12/265,861

(22) Filed: Nov. 6, 2008

(65) Prior Publication Data
US 2009/0256150 A1 Oct. 15, 2009

(30) Foreign Application Priority Data

Apr. 14, 2008 (KR) .................. 10-2008-0034348

(51) Int. Cl.
*H01L 23/62* (2006.01)
(52) U.S. Cl. ........ 257/59; 257/72; 257/83; 257/E27.132

(58) Field of Classification Search .................... 257/59, 257/72, 83, E27.132; 313/500; 349/40
See application file for complete search history.

(56) References Cited

U.S. PATENT DOCUMENTS 5,671,026 A * 9/1997 Shiraki et al. .................. 349/40
2007/0268637 A1 * 11/2007 Hsu et al. ........................ 361/56
* cited by examiner

*Primary Examiner* — Minh-Loan T Tran
(74) *Attorney, Agent, or Firm* — Cantor Colburn LLP

(57) ABSTRACT

A thin film transistor array panel according to an exemplary embodiment of the present invention comprises a substrate; a first signal line and a second signal line disposed on the substrate; a switching thin film transistor connected to the first signal line and the second signal line, and comprising a first insulating layer; a driving thin film transistor connected to the switching thin film transistor and comprising a second insulating layer; and a discharge thin film transistor connected to one of the first signal line and the second signal line, and comprising the first insulating layer and the second insulating layer.

16 Claims, 14 Drawing Sheets

THIN FILM TRANSISTOR ARRAY PANEL AND METHOD FOR MANUFACTURING THE SAME

This application claims priority to Korean Patent Application No. 10-2008-0034348, filed on Apr. 14, 2008, and all the benefits accruing therefrom under 35 U.S.C. §119, the contents of which in its entirety are herein incorporated by reference.

BACKGROUND OF THE INVENTION

1. Field of the Invention

The present invention relates to a thin film transistor array panel and a manufacturing method thereof. More particularly, the present invention relates to a thin film transistor array panel and a manufacturing method thereof that prevents current leakage in thin film transistors of the thin film transistor array panel, which results in a loss of data voltage or gate-on voltage.

2. Description of the Related Art

A thin film transistor array panel is used as a circuit board to independently drive pixels in a liquid crystal display or an organic light emitting device.

The organic light emitting device includes two electrodes and an organic light emitting layer interposed between the two electrodes. One of the two electrodes injects holes and the other electrode injects electrons into the light emitting layer. The injected electrons and holes are combined to form excitons. The excitons emit light as discharging energy.

The thin film transistor array panel of the organic light emitting device includes switching thin film transistors connected to signal lines which control data voltages and drive thin film transistors to direct a current to a light-emitting device by applying transmitted data voltages as gate voltages.

The peripheral area of the thin film transistor array panel includes an electrostatic discharge protection circuit, which is connected to gate lines or data lines. The electrostatic discharge protection circuit protects the main circuit of the thin film transistor array panel by discharging static electricity to drop a static voltage, or by charging static charges in a capacitor and breaking down under an overvoltage. The electrostatic discharge protection circuit includes thin film transistors that are turned on when a voltage of more than a threshold voltage (turn-on voltage) is applied.

However, when the threshold voltage of the electrostatic discharge protection circuit is low, current leakage occurs which results in a loss of gate-on voltage or data voltage.

Thus, it is desired to develop a thin film transistor array panel which prevents current leakage in thin film transistors of the thin film transistor array panel.

BRIEF SUMMARY OF THE INVENTION

A thin film transistor array panel according to an exemplary embodiment of the present invention includes a substrate; a first signal line disposed on the substrate; a second signal line disposed on the substrate; a switching thin film transistor connected to the first signal line and the second signal line and including a first insulating layer; a driving thin film transistor connected to the switching thin film transistor and including a second insulating layer; and a discharge thin film transistor connected to one of the first signal line and the second signal line and including the first insulating layer and the second insulating layer.

The switching thin film transistor may further include a first control electrode connected to the first signal line; a first input electrode connected to the second signal line; a first output electrode facing the first input electrode and connected to the driving thin film transistor; and a first semiconductor disposed between the first control electrode, and the first input electrode and the first output electrode, wherein the first insulating layer is disposed between the first control electrode and the first semiconductor.

The driving thin film transistor may further include a second control electrode connected to the first output electrode, a second input electrode overlapping a portion of the second control electrode, a second output electrode facing the second input electrode, and a second semiconductor disposed between the second control electrode, and the second input electrode and the second output electrode, wherein the second insulating layer may be disposed between the second control electrode and the second semiconductor.

The second insulating layer may be disposed under the first insulating layer.

The thin film transistor array panel may further include a driving voltage line insulated from and intersecting one of the first signal line and the second signal line, wherein the second input electrode may be connected to the driving voltage line.

The thin film transistor array panel may further include a display area; a peripheral area disposed on a circumference of the display area; and a short line disposed in the peripheral area.

The discharge thin film transistor may further include a discharge control electrode; a discharge input electrode; a discharge output electrode; and a discharge semiconductor disposed between the discharge control electrode, and the discharge input electrode and the discharge output electrode, wherein the first insulating layer and the second insulating layer are disposed between the discharge control electrode and the discharge semiconductor.

The discharge control electrode and the discharge input electrode may be connected to one of the first signal line and the second signal line, and the discharge output electrode may be connected to the short line.

The discharge control electrode and the discharge input electrode may be connected to the short line; and the discharge output electrode may be connected to one of the first signal line and the second signal line.

The first semiconductor and the discharge semiconductor may include an amorphous semiconductor, and the second semiconductor may include a crystallized semiconductor.

The discharge control electrode and the second control electrode may be disposed in a same layer.

The first control electrode, the second input electrode, and the second output electrode may be disposed in a same layer.

The first semiconductor and the discharge semiconductor may be disposed in a same layer, and the first input electrode, the first output electrode, the discharge input electrode and the discharge output electrode may be disposed in a same layer.

A manufacturing method of a thin film transistor array panel according to an exemplary embodiment of the present invention includes forming a driving control electrode and a discharge control electrode on a substrate; forming a first insulating layer on the driving control electrode and the discharge control electrode; forming a driving semiconductor on the first insulating layer; forming a switching control electrode, a driving voltage line, and a driving output electrode on the first gate insulating layer and the driving semiconductor by photolithography; forming a second insulating layer on the switching control electrode, the driving voltage line, the driving output electrode, and the first insulating layer; forming a switching semiconductor and a discharge semiconductor on the second insulating layer; forming a data line including a switching input electrode, a switching output electrode, a discharge input electrode, and a discharge output electrode on the second insulating layer, the switching semiconductor, and the discharge semiconductor; forming a pixel electrode connected to the driving output electrode; forming a light emitting member on the pixel electrode; and forming a common electrode on the light emitting member.

The forming of the driving semiconductor may include depositing a crystallized semiconductor.

The forming of the driving semiconductor may include forming an amorphous semiconductor; and crystallizing the amorphous semiconductor.

DETAILED DESCRIPTION OF THE INVENTION

Figure 1:
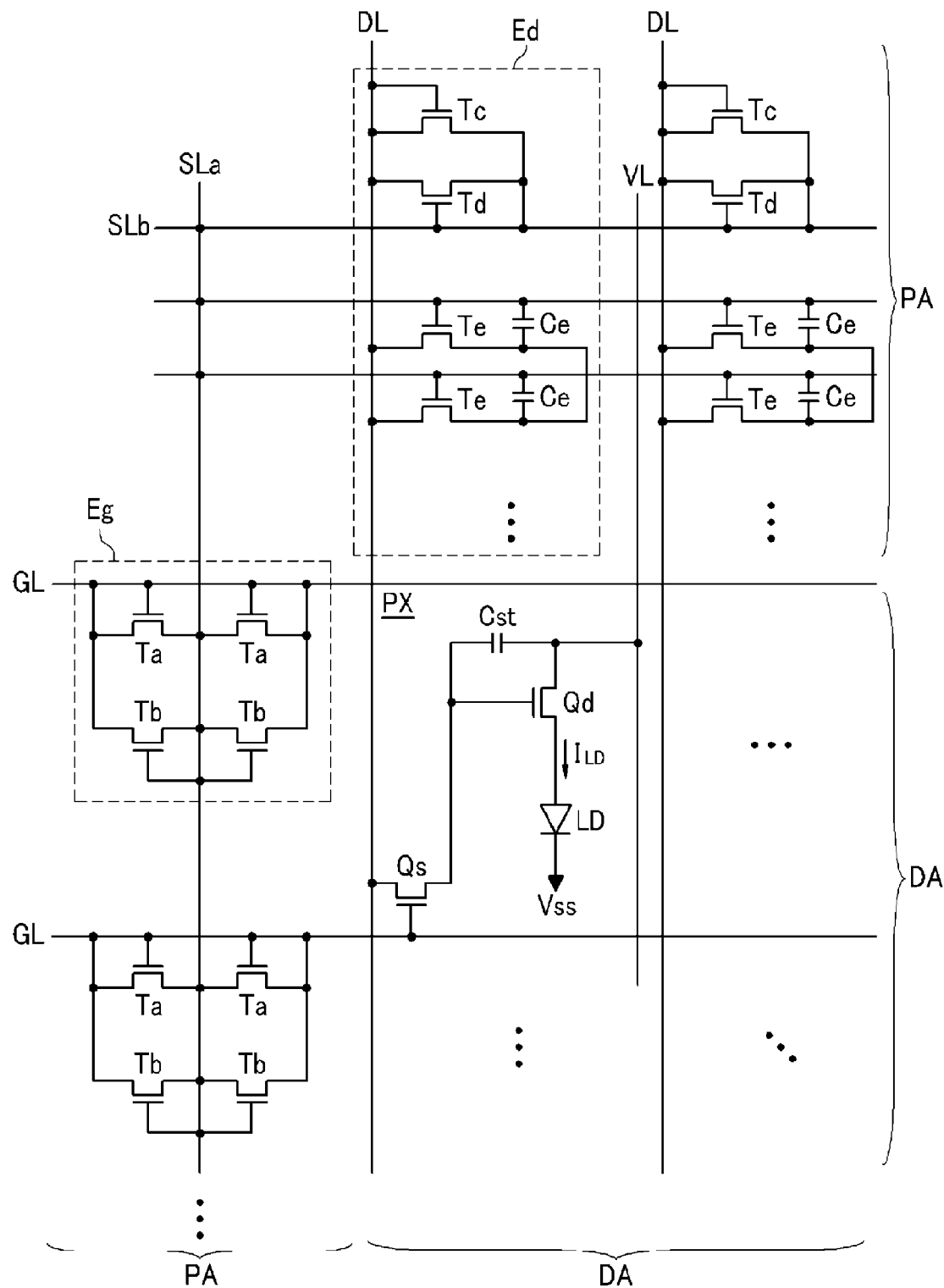
FIG. 1 is a circuit diagram of a thin film transistor array panel for a display device according to an exemplary embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

FIG. 1 is a circuit diagram of a thin film transistor array panel for a display device according to an exemplary embodiment of the present invention.

Referring to FIG. 1, the thin film transistor array panel includes a display area DA forming a screen and a peripheral area PA.

The display area DA includes a plurality of signal lines and a plurality of pixels PX connected thereto. The plurality of pixels PX are approximately arranged in a matrix.

The signal lines include a plurality of scanning signal lines GL transmitting scanning signals, a plurality of data lines DL transmitting data voltages, and a plurality of driving voltage lines VL transmitting a driving voltage Vdd. The scanning signal lines GL extend substantially in a row and are substantially parallel to each other. The data lines DL and the driving voltage lines VL extend substantially in a column and are substantially parallel to each other.

Each pixel PX includes a switching transistor Qs, a driving transistor Qd, a storage capacitor Cst and an organic light emitting element LD.

The switching transistor Qs and the driving transistor Qd each includes a control terminal, an input terminal and an output terminal.

The control terminal of the switching transistor Qs is connected to a scanning signal line GL. The input terminal of the switching transistor Qs is connected to a data line DL, and the output terminal is connected to a driving transistor Qd. The switching transistor Qs transmits a data signal, which is applied to the data line DL, to the driving transistor Qd in response to a gate signal, which is applied to the scanning signal line GL.

The control terminal of the driving transistor Qd is connected to the switching transistor Qs. The input terminal of the driving transistor Qd is connected to the driving voltage line VL and the output terminal of the driving transistor Qd is connected to the organic light emitting element LD. The driving transistor Qd drives an output current $I_{LD}$ having a magnitude which depends on the voltage between the control terminal and the output terminal of the driving transistor Qd.

A storage capacitor Cst is connected between the control terminal and the input terminal of the driving transistor Qd. The capacitor Cst stores a data voltage applied to the control terminal of the driving transistor Qd and maintains the data voltage after the switching transistor Qs turns off.

The organic light emitting element LD may be an organic light emitting diode ("OLED"). The organic light emitting element LD has an anode connected to the output terminal of the driving transistor Qd and a cathode connected to a common voltage Vss. The organic light emitting element LD emits light having an intensity which depends on an output current $I_{LD}$ of the driving transistor Qd. As a result, images are displayed.

The switching transistor Qs and the driving transistor Qd are n-channel field effect transistors ("FETs") and may include amorphous silicon or polysilicon. However, at least one of the switching transistor Qs and the driving transistor Qd may be a p-channel FET. In addition, connections among the transistors Qs and Qd, the capacitor Cst and the organic light emitting diode LD may be modified.

The peripheral area PA includes a plurality of transverse short lines SLb, longitudinal short lines SLa and scanning signal lines GL. The peripheral area PA further includes a plurality of first static electricity discharge protection circuits Eg connected to the longitudinal short lines SLa and a plurality of second static electricity discharge protection circuits Ed connected to the data lines DL and the transverse short lines SLb.

The transverse short lines SLb substantially extend in a row and are parallel to each other. The longitudinal short lines SLa substantially extend in a column direction and are electrically connected to the transverse short lines SLb.

The first static electricity discharge protection circuits Eg include a pair of first upper discharge transistors Ta and a pair of first lower discharge transistors Tb, and the first upper discharge transistor Ta and the first lower discharge transistor Tb each includes a control terminal, an input terminal and an output terminal.

The control terminal and the input terminal of the first upper discharge transistor Ta are connected to the scanning signal line GL. The output terminal of the first upper discharge transistor Ta is connected to the longitudinal short line SLa. The control terminal and the input terminal of the first lower discharge transistor Tb are connected to the longitudinal short line SLa and the output terminal of the first lower discharge transistor Tb is connected to the scanning signal line GL. If static electricity of more than a threshold voltage flows to the scanning signal line GL, the first upper discharge transistor Ta is turned on, and the static electricity is transmitted to the longitudinal short line SLa through the first upper discharge transistor Ta. Then, the first lower discharge transistor Tb of other first static electricity discharge protection circuits Eg connected to other scanning signal lines GL are turned on by the static electricity transmitted to the longitudinal short line SLa. Further, the static electricity is dispersed into other scanning signal lines GL through the first lower discharge transistors Tb.

The second static electricity discharge protection circuits Ed include a second upper discharge transistor Tc, a second lower discharge transistor Td, a third discharge transistor Te and a discharge capacitor Ce.

The control terminal and the input terminal of the second upper discharge transistor Tc are connected to the data line DL, and the output terminal of the second upper discharge transistor Tc is connected to the transverse short line SLb. Also, the control terminal and the input terminal of the second lower transistor Td are connected to the transverse short line SLb and the output terminal thereof is connected to the data line DL. If static electricity of more than the threshold voltage flows to a data line DL, the second upper discharge transistor Tc is turned on, and the static electricity is transmitted to the transverse short line SLb through the second upper discharge transistor Tc. Thus, the second lower discharge transistors Td of other second static electricity discharge protection circuits Ed connected to other data lines DL are turned on by the static electricity transmitted to the transverse short line SLb, and the static electricity is dispersed into other data lines DL through the second lower discharge transistors Td. However, the static electricity flowing to the data line DL is charged in the discharge capacitor Ce through the third discharge transistor Te, and the third discharge transistor Te breaks down under an overvoltage as a substitute for the transistors Qs and Qd in the display area DA such that the circuit of the display area DA is protected.

Hereinafter, the structure of the thin film transistor array panel in FIG. 1 will be described in detail with reference to FIG. 2 to FIG. 4.

Figure 2:
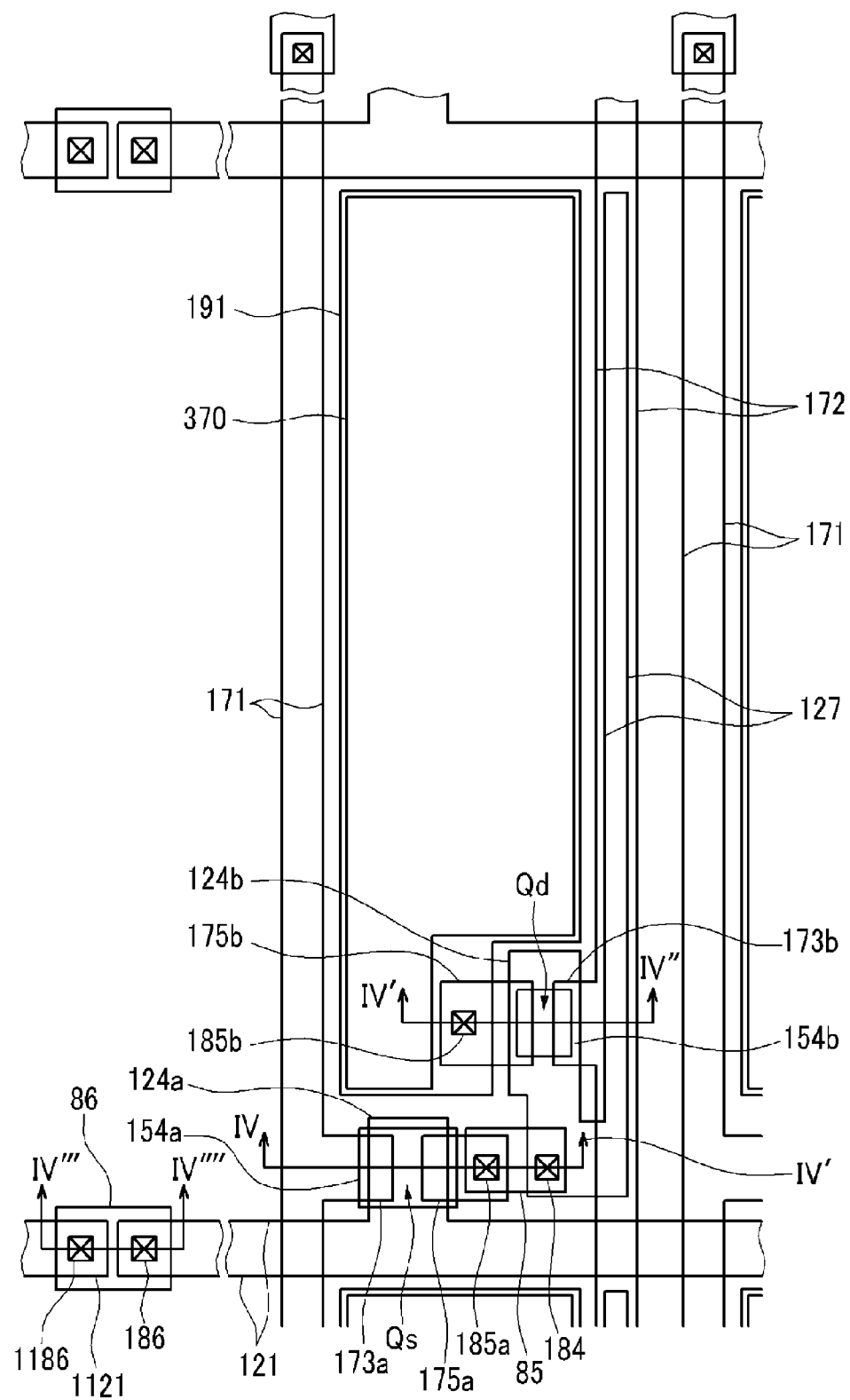
FIG. 2 is a layout view of one pixel in the thin film transistor array panel for the display device according to an exemplary embodiment of the present invention.
Figure 3:
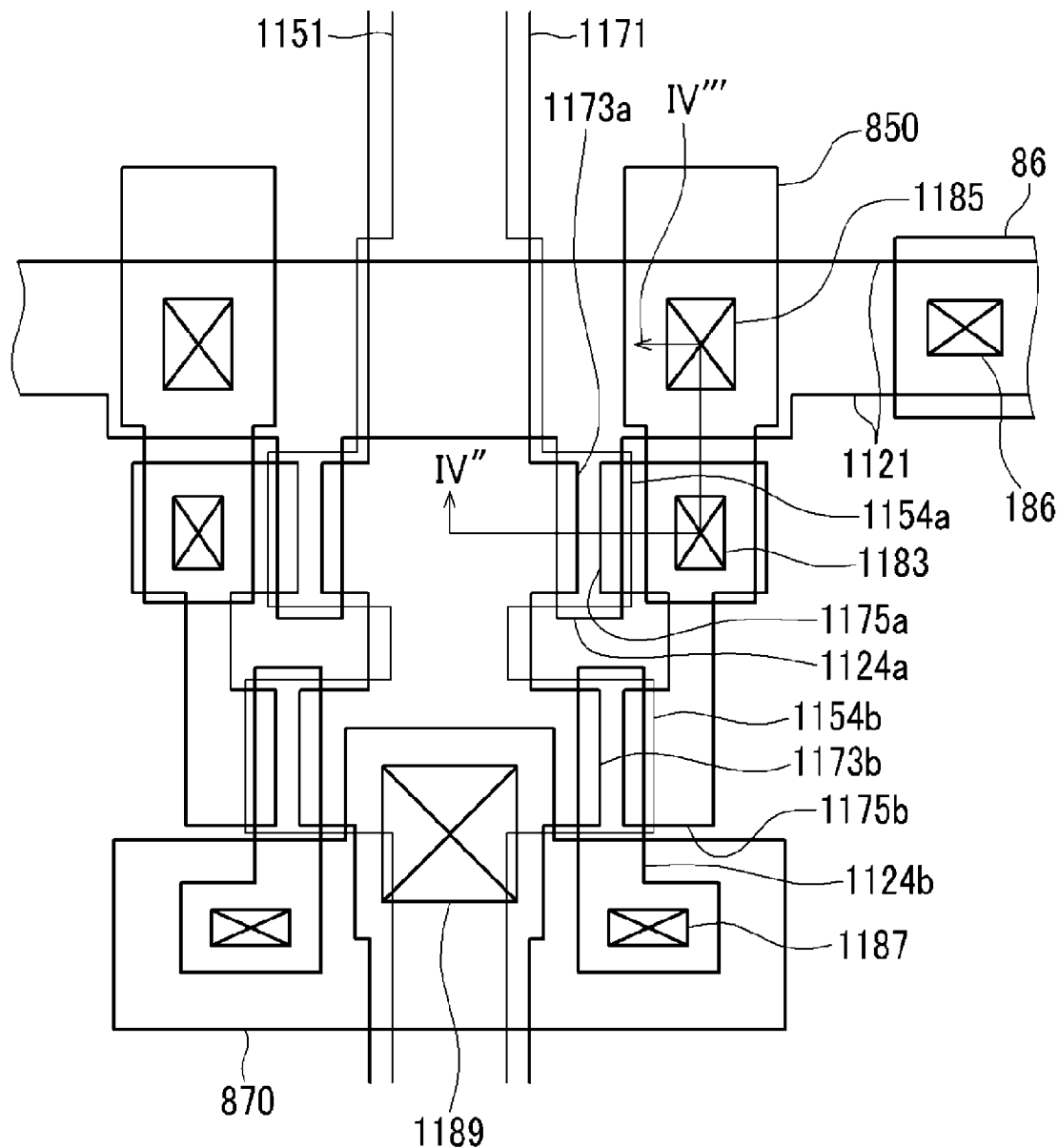
FIG. 3 is a layout view of an electrostatic discharge protection circuit of the thin film transistor array panel for the display device according to an exemplary embodiment of the present invention.
Figure 4:
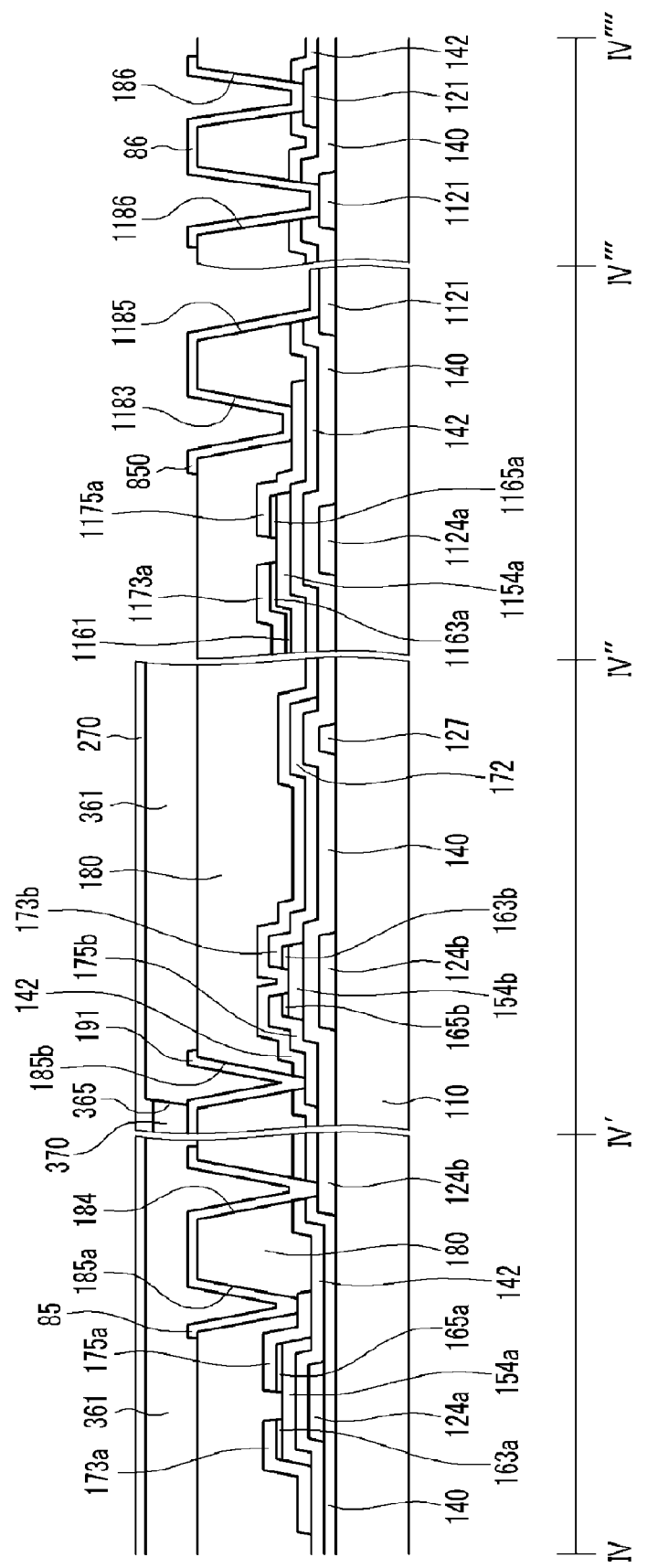
FIG. 4 is a partial cross-sectional view of the thin film transistor array panel in FIG. 2 taken along lines IV-IV', IV'-IV", and IV'''-IV'''', and the electrostatic discharge protection circuit in FIG. 3 taken along line IV"-IV'''.

FIG. 2 is a layout view of one pixel in the thin film transistor array panel for the display device according to an exemplary embodiment of the present invention, FIG. 3 is a layout view of an electrostatic discharge protection circuit of the thin film transistor array panel for the display device according to an exemplary embodiment of the present invention, and FIG. 4 is a partial cross-sectional view of the thin film transistor array panel in FIG. 2 taken along lines IV-IV', IV'-IV'', and IV'''-IV'''', and the electrostatic discharge protection circuit in FIG. 3 taken along line IV''-IV'''.

A plurality of gate conductors including a plurality of driving control electrodes 124*b*, a plurality of discharge scanning signal lines 1121 and a plurality of pairs of lower discharge control electrodes 1124*b* (shown in FIG. 3) are disposed on an insulating substrate 110 (shown in FIG. 4). The discharge scanning signal lines 1121 and the lower discharge control electrodes 1124b are disposed in the peripheral area of the thin film transistor array panel.

The driving control electrodes 124b have an island shape and include a storage electrode 127 extending in the longitudinal direction.

Referring to FIG. 3, the discharge scanning signal lines 1121 transmit scanning signals, substantially extend in the transverse direction and include a pair of upper discharge control electrodes 1124a protruding downward.

The lower discharge control electrodes 1124b have an island shape, and one lower discharge control electrode 1124b is disposed under each of the upper discharge control electrodes 1124a. The lower discharge control electrodes 1124b include a portion extending shortly in the longitudinal direction and a wide portion for connection with another layer.

Referring to FIG. 4, a lower gate insulating layer 140 that may include silicon nitride or silicon oxide is disposed on the gate conductors including the driving control electrodes 124b, the discharge scanning signal lines 1121 and the lower discharge control electrodes 1124b.

A plurality of driving semiconductors 154b (shown in FIGS. 3 and 4) is formed on the lower gate insulating layer 140. The driving semiconductors 154b are disposed on the driving control electrodes 124b and may be made of crystalline silicon.

Still referring to FIG. 4, a plurality of pairs of ohmic contacts 163b and 165b are disposed on the driving semiconductors 154b. The ohmic contacts 163b and 165b have an island shape and may include a material such as amorphous silicon or polysilicon that are heavily doped with an n-type impurity such as phosphorous.

A plurality of first data conductors including a plurality of scanning signal lines 121 including a plurality switching control electrodes 124a, a plurality of driving voltage lines 172 including a plurality of driving input electrodes 173b, and a plurality of driving output electrodes 175b, are disposed on the ohmic contacts 163b and 165b and the lower gate insulating layer 140.

The scanning signal lines 121 transmit scanning signals and extend in the transverse direction, and the switching control electrodes 124a extend upward from the scanning signal lines 121.

The driving voltage lines 172 transmit a driving voltage and substantially extend in the longitudinal direction, thereby intersecting the scanning signal lines 121. Each driving voltage line 172 includes a plurality of driving input electrodes 173b extending toward the driving control electrodes 124b and overlaps the storage electrode 127.

The driving output electrodes 175b are separated from the scanning signal lines 121, the data lines 171 and the driving voltage lines 172. The driving input electrodes 173b and the driving output electrodes 175b are opposite to each other on the driving semiconductors 154b.

The scanning signal lines 121, the driving voltage lines 172 and the driving output electrodes 175b of the first data conductors may include the same material as the gate conductors including the driving control electrodes 124b, the discharge scanning signal lines 1121 and the lower discharge control electrode 1124b.

An upper gate insulating layer 142, which may include silicon nitride or silicon oxide, is disposed on the scanning signal lines 121, the driving voltage lines 172 and the driving output electrodes 175b.

A plurality of switching semiconductors 154a and a plurality of discharge semiconductor stripes 1151 (as shown in FIG. 3 and FIG. 4) which is disposed in the peripheral area of the thin film transistor array panel are formed on the upper gate insulating layer 142.

The switching semiconductors 154a are disposed on the switching control electrodes 124a, and the discharge semiconductor stripes 1151 substantially extend in the longitudinal direction. Also, the discharge semiconductor stripes 1151 include an upper protrusion 1154a and a lower protrusion 1154b extending to the left side and right side toward the upper discharge control electrode 1124a and the lower discharge control electrode 1124b, respectively. The switching semiconductors 154a and the discharge semiconductor stripes 1151 may include hydrogenated amorphous silicon.

A plurality of ohmic contact island pairs 163a and 165a are disposed on the switching semiconductors 154a, and a plurality of ohmic contact stripes 1161 and a plurality of ohmic contact islands 1165a are disposed on the discharge semiconductor stripes 1151. The ohmic contact stripes 1161 include a plurality of protrusions 1163a disposed on and partially overlapping the upper protrusion 1154a and the lower protrusion 1154b of the discharge semiconductor stripes 1151. The ohmic contacts 163a, 165a, 1161, and 1165a may include silicide or n+ hydrogenated amorphous silicon in which an n-type impurity such as phosphorus is highly doped.

The second data conductors including a plurality of data lines 171, a plurality of switching output electrodes 175a, a longitudinal short line 1171, and a plurality of upper discharge output electrodes 1175a and a plurality of lower discharge output electrodes 1175b are disposed on the ohmic contacts 163a, 165a, 1161, and 1165a and the upper gate insulating layer 142. The longitudinal short line 1171 and the upper discharge output electrode 1175a and the lower discharge output electrodes 1175b are disposed in the peripheral area of the thin film transistor array panel.

The data lines 171 transfer data signals and extend substantially in a longitudinal direction to cross the scanning signal lines 121. Each data line 171 includes a plurality of switching input electrodes 173a (shown in FIG. 4) extending toward the switching control electrodes 124a.

The switching output electrodes 175a are separated from the data lines 171. The switching input electrodes 173a and the switching output electrodes 175a are opposite to each other with respect to the switching semiconductors 154a.

The longitudinal short line 1171 extends in a longitudinal direction, thereby intersecting the discharge scanning signal line 1121. The longitudinal short line 1171 includes a plurality of upper discharge input electrodes 1173a and a plurality of lower discharge input electrodes 1173b extending toward the upper discharge control electrode 1124a and the lower discharge control electrode 1124b, respectively.

The upper discharge output electrode 1175a/lower discharge output electrode 1175b is disposed opposite the upper discharge input electrode 1173a/lower discharge input electrode 1173b with respect to the upper discharge control electrode 1124a/lower discharge control electrode 1124b. The upper discharge output electrode 1175a and the lower discharge output electrode 1175b are connected to each other in a longitudinal direction.

The second data conductors including the data lines 171, the switching output electrodes 175a, the longitudinal short line 1171, the upper discharge output electrodes 1175a and the lower discharge output electrodes 1175b may include the same material as the gate conductors 124b, 1121, and 1124b.

A passivation layer 180 is disposed on the second data conductors including the data lines 171, the switching output electrodes 175a, the longitudinal short line 1171, the upper discharge output electrodes 1175a and the lower discharge output electrodes 1175b.

The passivation layer 180 has a plurality of contact holes 185a exposing the switching output electrodes 175a, a plurality of contact holes 1183 exposing the upper discharge output electrodes 1175a and a contact hole 1189 (as shown in FIG. 3) exposing a portion of the longitudinal short line 1171. The passivation layer 180 and the upper gate insulating layer 142 have a plurality of contact holes 185b exposing the driving output electrodes 175b, and a plurality of contact holes 186 exposing the end portions of the scanning signal lines 121. The passivation layer 180, the upper gate insulating layer 142 and the lower gate insulating layer 140 include a plurality of contact holes 184 exposing the driving control electrodes 124b, a plurality of contact holes 1185 and 1186 exposing the discharge scanning signal lines 1121, and a plurality of contact holes 1187 exposing the lower discharge control electrodes 1124b.

A plurality of pixel electrodes 191 and a plurality of connecting members 85, 86, 850, and 870 are disposed on the passivation layer 180.

The pixel electrodes 191 are electrically connected to the driving output electrodes 175b through the contact holes 185b.

The connecting member 85 is connected to the switching output electrode 175a and the driving control electrode 124b through the contact holes 184 and 185a. The connecting member 86 is connected to the scanning signal line 121 and the discharge scanning signal line 1121 through the contact holes 186 and 1186. The connecting member 850 is connected to the upper discharge output electrode 1175a and the discharge scanning signal line 1121 through the contact holes 1183 and 1185. The connecting member 870 is connected to the lower discharge control electrode 1124b and the longitudinal short line 1171 through the contact holes 1187 and 1189.

The pixel electrodes 191 and the connecting members 85, 86, 850, and 870 may include a transparent conductor such as indium tin oxide ("ITO") or indium zinc oxide ("IZO").

A plurality of partitions 361 are disposed on the passivation layer 180, the pixel electrodes 191 and the connecting members 85, 86, 850, and 870. The partition 361 surrounds the edges of the pixel electrodes 191 like a bank, thereby defining a plurality of openings 365. The partition 361 may include an organic insulator or an inorganic insulator. The partition 361 may also include a photoresist including a black pigment, and as a result, the partition 361 may function as a light blocking member and the manufacturing process of the partition 361 may be simplified.

A plurality of organic light emitting members 370 are disposed in the openings 365, which are disposed on the pixel electrodes 191 defined by the partitions 361. The organic light emitting members 370 may include an organic material that emits light of one of three primary colors such as red, green, and blue, for example. The OLED display displays a desired image through a spatial sum of the primary color lights emitted from the organic light emitting members 370.

A common electrode 270 is disposed on the organic light emitting members 370. The common electrode 270 is disposed on the entire surface of the substrate and forms a pair along with a pixel electrode 191. As a result, current flows to the organic light emitting member 370.

In the display area DA of the thin film transistor array panel, the switching control electrode 124a/driving control electrode 124b, the switching input electrode 173a/driving input electrode 173b, and the switching output electrode 175a/driving output electrode 175b form a switching transistor Qs/driving transistor Qd along with the switching semiconductor 154a/driving semiconductor 154b. The channel of the switching transistor Qs/driving transistor Qd is formed in the switching semiconductor 154a/driving semiconductor 154b between the switching input electrode 173a/driving input electrode 173b and the switching output electrode 175a/driving output electrode 175b.

In the peripheral area PA of the thin film transistor array panel, the upper discharge control electrode 1124a/lower discharge control electrode 1124b, the upper discharge input electrode 1173a/lower discharge input electrode 1173b, and the upper discharge output electrode 1175a/lower discharge output electrode 1175b form an upper discharge transistor Ta/lower discharge transistor Tb along with the upper protrusion 1154a/lower protrusion 1154b of the discharge semiconductor 1151. v Further, the channel of the upper discharge transistor Ta/lower discharge transistor Tb is formed in the upper discharge semiconductor 1154a/lower discharge semiconductor 1154b between the upper discharge input electrode 1173a/lower discharge input electrode 1173b and the upper discharge output electrode 1175a/lower discharge output electrode 111175b.

According to an exemplary embodiment of the present invention, the double insulating layer including the lower gate insulating layer 140 and the upper gate insulating layer 142 are disposed between the discharge control electrodes 1124a and 1124b and the discharge semiconductors 1154a and 1154b of the discharge transistors Ta and Tb such that a threshold voltage to turn on the discharge transistors Ta and Tb is increased compared with a single insulating layer. Accordingly, current leakage due to a gate-on voltage applied to the scanning signal line 121 is blocked, thereby preventing loss of the gate-on voltage.

Also, the switching semiconductor 154a and the discharge semiconductors 1151 may be made of an amorphous semiconductor, and the driving semiconductor 154b may be made of a crystallized semiconductor. Accordingly, the channel of the driving transistor is formed in the crystallized semiconductor, thereby obtaining high carrier mobility and stability. Further, the channel of the switching transistor is formed in the amorphous semiconductor having a low off-current to prevent reduction of the data voltage and crosstalk.

The pixel electrodes 191, the light emitting members 370 and the common electrode 270 form organic light emitting diodes LD, wherein the pixel electrodes 191 are anodes and the common electrode 270 is a cathode. Alternatively, the pixel electrodes 191 are cathodes and the common electrode 270 is an anode. Also, the storage electrode 127 and the driving voltage line 172, which overlap each other, form the storage capacitor Cst.

Hereinafter, a manufacturing method of the thin film transistor array panel shown in FIG. 2 to FIG. 4, according to an exemplary embodiment of the present invention, will be described in detail with reference to FIG. 5 to FIG. 13.

FIG. 5 to FIG. 13 are layout views of the thin film transistor array panel for the display device shown in FIG. 2 to FIG. 4 in sequential processes of a manufacturing method according to an exemplary embodiment of the present invention.

Figure 5:
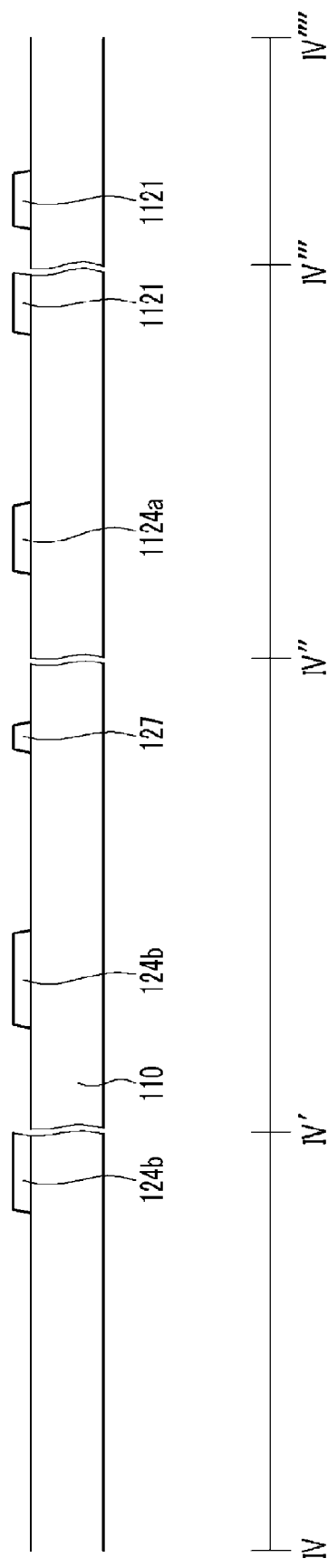
FIG. 5 to FIG. 13 are layout views of the thin film transistor array panel for the display device shown in FIG. 2 to FIG. 4 in sequential processes of a manufacturing method according to an exemplary embodiment of the present invention.

As shown in FIG. 5, a plurality of gate conductors including a plurality of driving control electrodes 124b including storage electrodes 127, a plurality of discharge scanning signal lines 1121 including a pair of upper discharge control electrodes 1124a, and a plurality of pairs of lower discharge control electrodes 1124b (shown in FIG. 3) are formed on a substrate 110 through photolithography.

Figure 6:
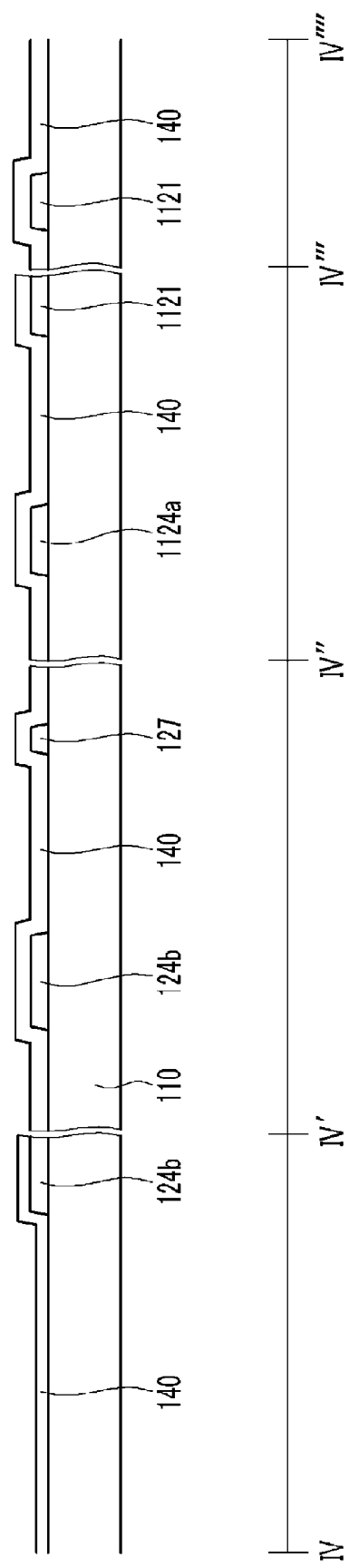
Figure 7:
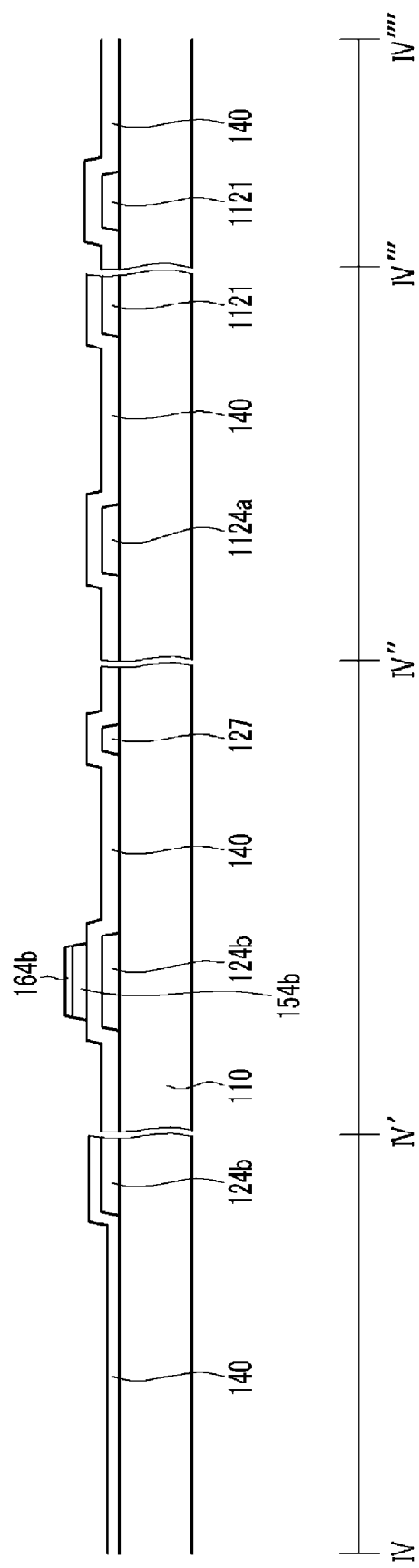

As shown in FIG. 6, a lower gate insulating layer 140 is formed on the gate conductors including the driving control electrodes 124b, the discharge scanning signal lines 1121 and the lower discharge control electrodes 1124b. As shown in FIG. 7, a crystallized silicon layer and an impurity-doped amorphous silicon layer are sequentially deposited on the lower gate insulating layer 140 and patterned by photolithography to form a driving semiconductor 154b and an ohmic contact layer 164b.

Alternatively, a lower gate insulating layer 140, an amorphous silicon layer and an impurity-doped amorphous silicon layer may be sequentially deposited on the driving control electrode 124b and crystallized. For crystallization, solid phase crystallization ("SPC"), rapid thermal annealing ("RTA"), liquid phase recrystallization ("LPR"), or excimer laser annealing ("ELA") may be used.

Figure 8:
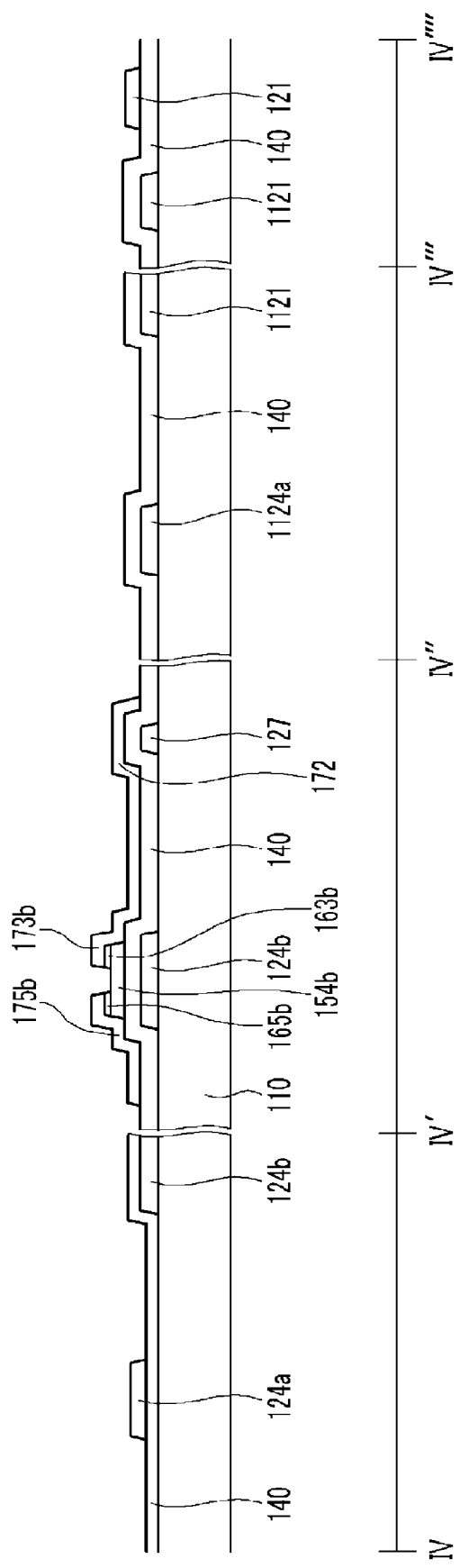

As shown in FIG. 8, a metal layer is deposited on the lower gate insulating layer 140 and the ohmic contact layer 164b (shown in FIG. 7) and patterned by photolithography to form the first data conductors including a plurality of scanning signal lines 121 including switching control electrodes 124a, a plurality of driving voltage lines 172 including driving input electrodes 173b, and a plurality of driving output electrodes 175b.

The ohmic contact layer 164b is then etched by using the driving voltage lines 172 and the driving output electrodes 175b as a mask to form a pair of ohmic contacts 163b and 165b.

Figure 9:
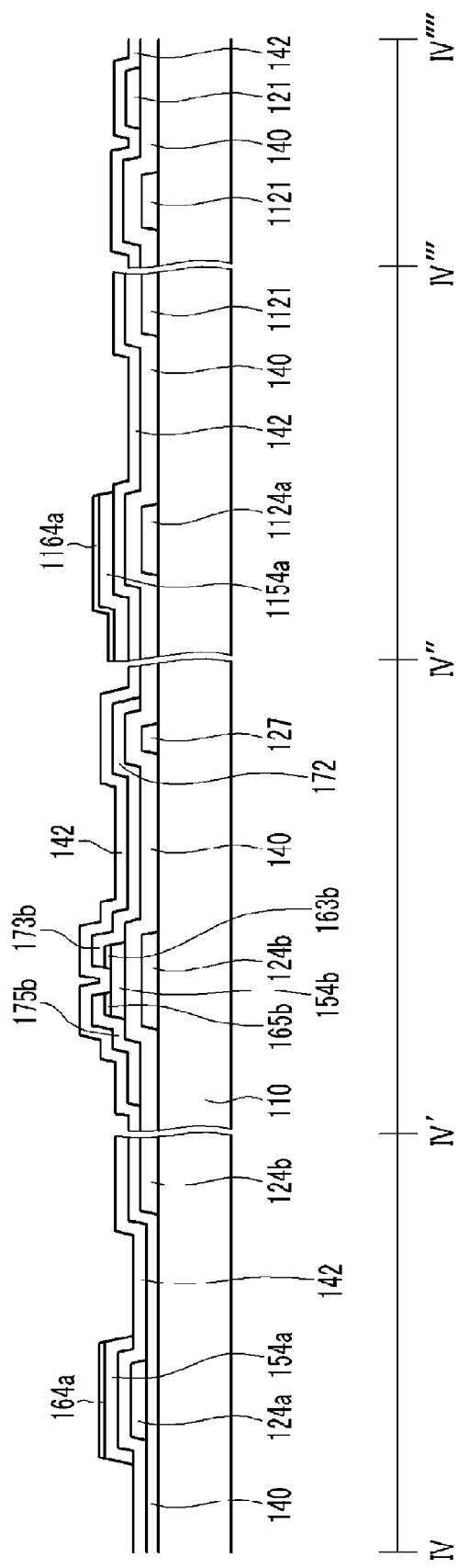

As shown in FIG. 9, an upper gate insulating layer 142, an intrinsic amorphous silicon layer and an impurity-doped amorphous silicon layer are sequentially deposited on the first data conductors including the scanning signal lines 121, the driving voltage lines 172 and the driving output electrodes 175b and, and are patterned by photolithography to form switching semiconductors 154a, discharge semiconductor stripes 1151 (shown in FIG. 3) including protrusions 1154a and 1154b and ohmic contact layers 164a and 1164a.

Figure 10:
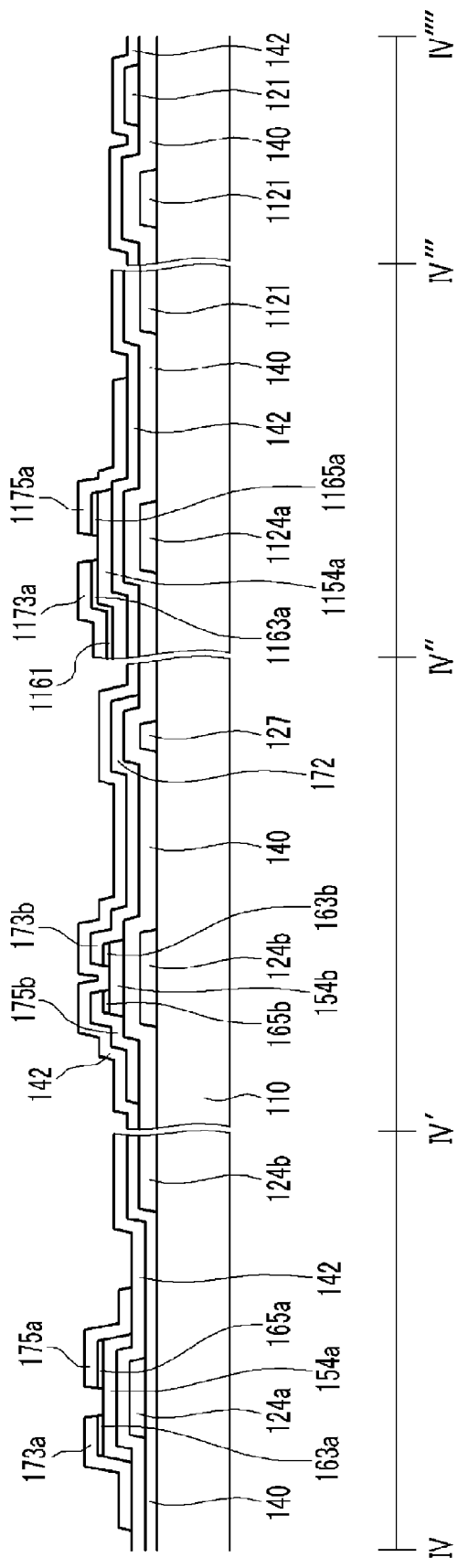

Then, as shown in FIG. 10, a metal layer is deposited on the upper gate insulating layer 142 and the ohmic contact layers 164a and 1164a, and patterned by photolithography to form second data conductors having a plurality of data lines 171 (shown in FIG. 2) including switching input electrodes 173a, a plurality of switching output electrodes 175a, a longitudinal short line 1171 (shown in FIG. 3) including upper discharge input electrodes 1173a and lower discharge input electrodes 1173b (shown in FIG. 3), and a plurality of upper discharge output electrodes 1175a and lower discharge output electrodes 1175b (shown FIG. 3).

Next, the ohmic contact layers 164a and 1164a (shown in FIG. 9) are etched by using the data lines 171, the switching output electrodes 175a, the longitudinal short line 1171, and the upper discharge output electrodes 1175a and the lower discharge output electrodes 1175b (shown in FIG. 3) as a mask to form a plurality of ohmic contact pairs 163a and 165a, an ohmic contact 1161 (shown in FIG. 4) including protrusions 1163a, and a plurality of ohmic contacts 1165a (shown in FIG. 10).

Figure 11:
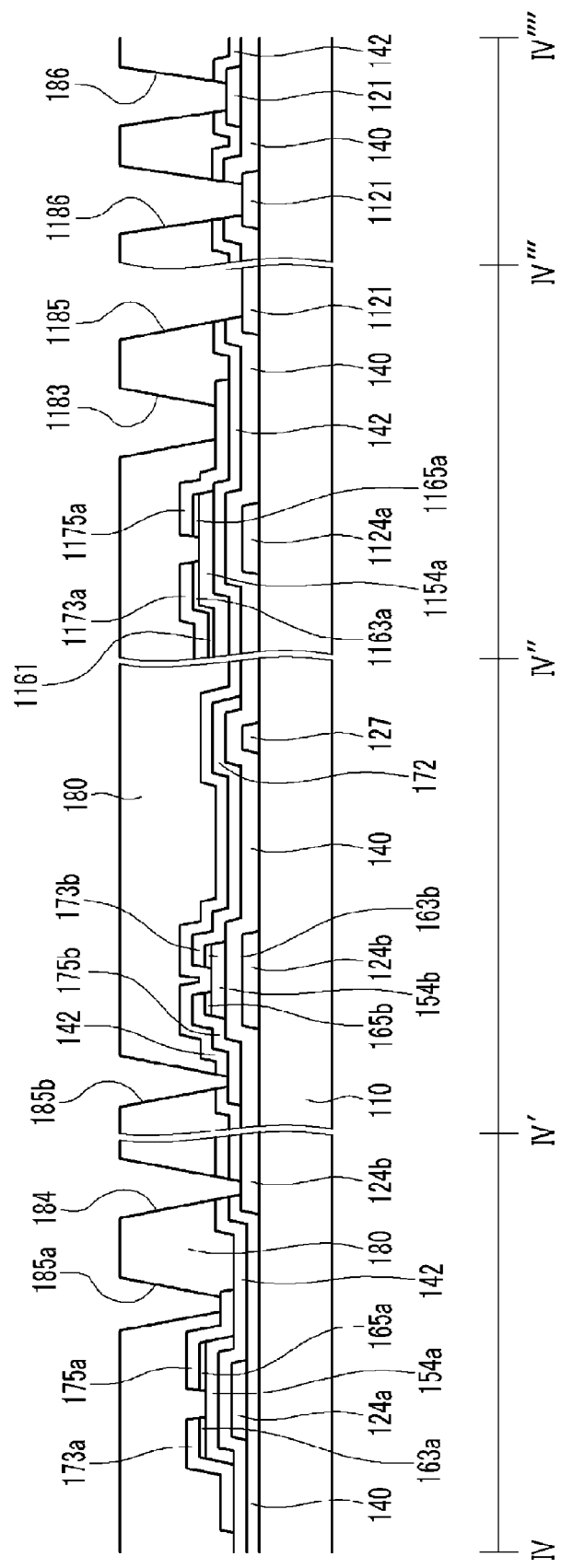

Next, as shown in FIG. 11, a passivation layer 180 is formed on the entire surface of the substrate and patterned by photolithography to form a plurality of contact holes 184, 185a, 185b, 186, 1183, 1185, 1186, 1187, and 1189.

Figure 12:
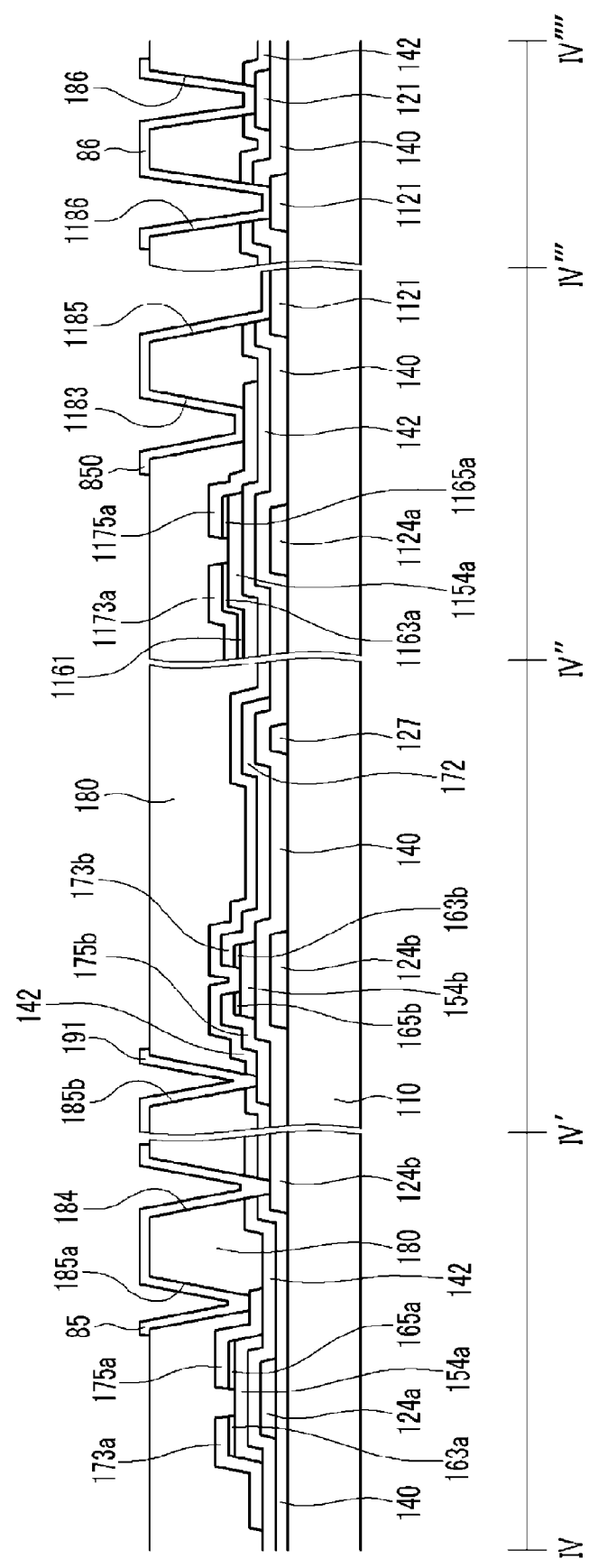
Figure 13:
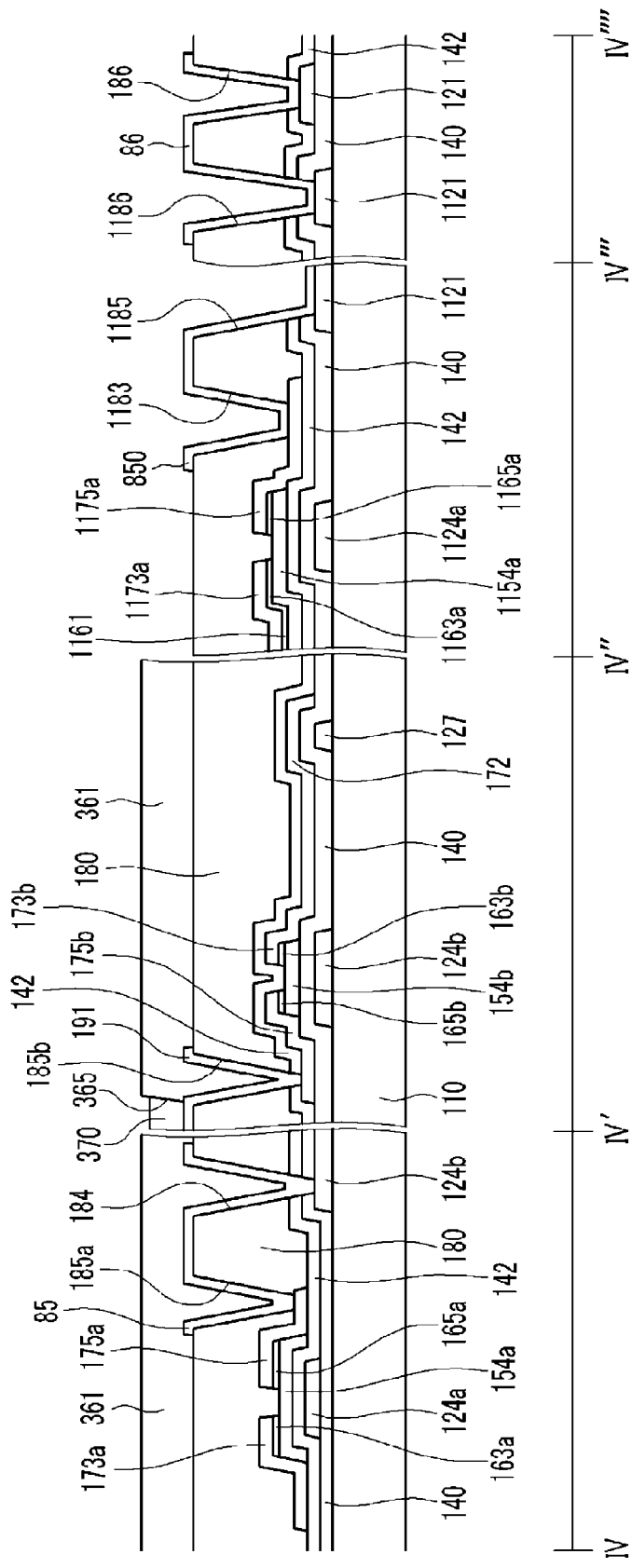

As shown in FIG. 12, ITO is deposited on the passivation layer 180 and patterned by photolithography to form a plurality of pixel electrodes 191 and a plurality of connecting members 85, 86, 850 and 870 (shown in FIG. 3).

As shown in FIG. 13 and FIG. 2 to FIG. 4, a photosensitive organic layer is then coated on the pixel electrodes 191, the connecting members 85, 86, 850, and 870, and the passivation layer 180, and is exposed to light and developed to form partitions 361 including a plurality of openings 365.

Next, a plurality of organic light emitting members 370 are formed in the openings 365. The organic light emitting members 370 may be formed by a solution process such as inkjet printing or by deposition.

Finally, as shown in FIG. 2 to FIG. 4, a common electrode 270 is formed on the partitions 361 and the organic light emitting members 370.

In an exemplary embodiment of the present invention shown in FIG. 2 to FIG. 13, the first static electricity discharge protection circuits Eg of FIG. 1 is described as an example. However, the second upper discharge transistor Tc and the lower discharge transistor Td of the second static electricity discharge protection circuits Ed, and the third discharge transistors Te may be composed like the discharge transistors Ta and Tb of the first static electricity discharge protection circuits Eg. For example, the discharge control electrodes of the discharge transistors Tc, Td, and Te may be formed in the same layer as the driving control electrodes 124b of the driving transistors Qd and the discharge semiconductors may be formed in the same layer as the switching semiconductors 154a of the switching transistors Qs, such that the upper and lower gate insulating layers may be disposed between the discharge control electrodes and the discharge semiconductors. Accordingly, the threshold voltages of the discharge transistors Tc, Td, and Te may be increased, and the current leakage flowing through the discharge transistors Tc, Td, and Te from the data lines 171 is blocked. As a result, loss of the data voltage is prevented.

Figure 14:
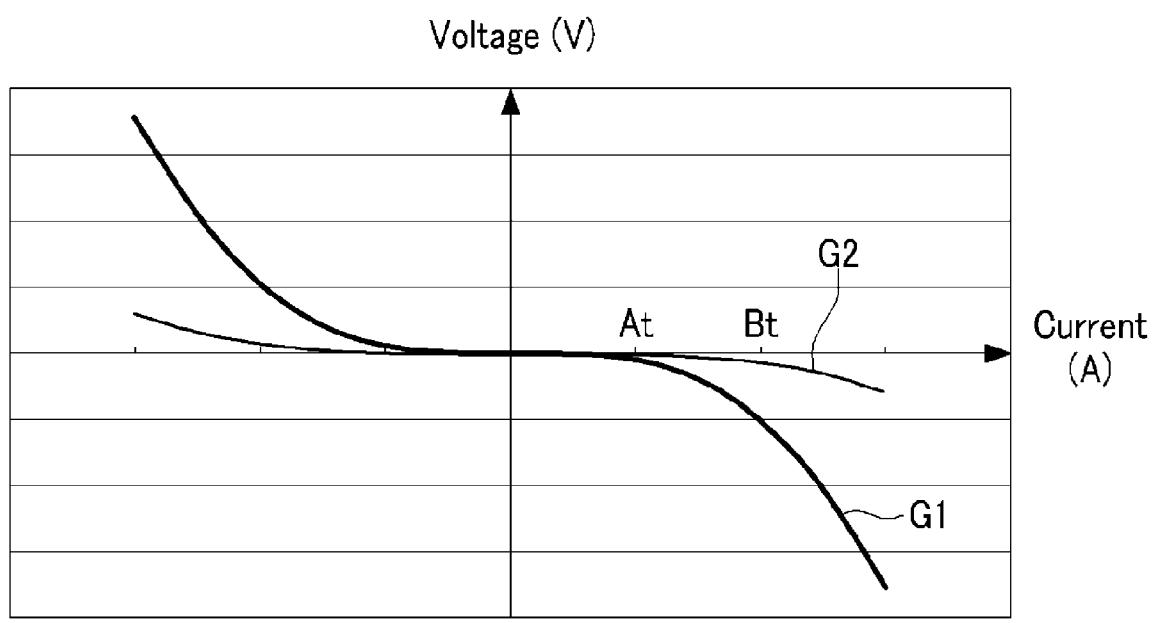
FIG. 14 is a graph of a voltage-current characteristic of the electrostatic discharge protection circuit of the thin film transistor array panel for the display device according to an exemplary embodiment of the present invention.

FIG. 14 is a graph of a voltage-current characteristic of the electrostatic discharge protection circuit of the thin film transistor array panel for a display device according to an exemplary embodiment of the present invention.

Referring to FIG. 14, the graph G1 shows a voltage-current characteristic of the discharge transistors Ta through Te including one insulating layer. The graph G2 shows a voltage-current characteristic of the discharge transistors Ta through Te including double insulating layer. In the graph G1, one insulating layer is disposed between the discharge control electrode and the discharge semiconductor of the discharge transistors Ta through Te. If the static electricity voltage is more than At, the leakage current is generated in the discharge transistors Ta through Te. However, the threshold voltage generating a leakage current is increased to Bt in the graph G2 where two insulating layers are included. As a result, loss of the data voltage or the gate-on voltage may be prevented.

According to an exemplary embodiment of the present invention, the threshold voltage of the transistors of the static electricity discharge protection circuit is raised such that current leakage through the transistors is prevented. As a result, loss of the data voltage and the gate-on voltage may be prevented.

The present invention should not be construed as being limited to the exemplary embodiments set forth herein. Rather, these exemplary embodiments are provided so that this disclosure will be thorough and complete and will fully convey the concept of the present invention to those skilled in the art.

While this invention has been particularly shown and described with reference to exemplary embodiments thereof, it will be understood by those of ordinary skill in the art that various changes in form and details may be made therein without departing from the spirit and/or scope of the present invention as defined by the following claims.

What is claimed is:

1. A thin film transistor array panel comprising:
   a substrate;
   a first signal line disposed on the substrate;
   a second signal line disposed on the substrate;
   a switching thin film transistor connected to the first signal line and the second signal line, and comprising a first insulating layer;
   a driving thin film transistor connected to the switching thin film transistor and comprising a second insulating layer; and
   a discharge thin film transistor connected to one of the first signal line and the second signal line and comprising the first insulating layer and the second insulating layer.

2. The thin film transistor array panel of claim 1, wherein the switching thin film transistor further comprises:
   a first control electrode connected to the first signal line;
   a first input electrode connected to the second signal line;
   a first output electrode facing the first input electrode and connected to the driving thin film transistor; and
   a first semiconductor disposed between the first control electrode, and the first input electrode and the first output electrode,
   wherein the first insulating layer is disposed between the first control electrode and the first semiconductor.

3. The thin film transistor array panel of claim 2, wherein the driving thin film transistor further comprises:
   a second control electrode connected to the first output electrode;
   a second input electrode overlapping a portion of the second control electrode;
   a second output electrode facing the second input electrode; and
   a second semiconductor disposed between the second control electrode, and the second input electrode and the second output electrode,
   wherein the second insulating layer is disposed between the second control electrode and the second semiconductor.

4. The thin film transistor array panel of claim 3, wherein the second insulating layer is disposed under the first insulating layer.

5. The thin film transistor array panel of claim 3, further comprising
   a driving voltage line insulated from and intersecting one of the first signal line and the second signal line, wherein the second input electrode is connected to the driving voltage line.

6. The thin film transistor array panel of claim 3, further comprising:
   a display area;
   a peripheral area disposed on a circumference of the display area; and
   a short line disposed in the peripheral area.

7. The thin film transistor array panel of claim 6, wherein the discharge thin film transistor further comprises:
   a discharge control electrode;
   a discharge input electrode;
   a discharge output electrode; and
   a discharge semiconductor disposed between the discharge control electrode, the discharge input electrode and the discharge output electrode,
   wherein the first insulating layer and the second insulating layer are disposed between the discharge control electrode and the discharge semiconductor.

8. The thin film transistor array panel of claim 7, wherein
   the discharge control electrode and the discharge input electrode are connected to one of the first signal line and the second signal line; and
   the discharge output electrode is connected to the short line.

9. The thin film transistor array panel of claim 7, wherein
   the discharge control electrode and the discharge input electrode are connected to the short line; and
   the discharge output electrode is connected to one of the first signal line and the second signal line.

10. The thin film transistor array panel of claim 7, wherein
    the first semiconductor and the discharge semiconductor comprise an amorphous semiconductor; and
    the second semiconductor comprises a crystallized semiconductor.

11. The thin film transistor array panel of claim 7, wherein the discharge control electrode and the second control electrode are disposed in a same layer.

12. The thin film transistor array panel of claim 7, wherein the first control electrode, the second input electrode and the second output electrode are disposed in a same layer.

13. The thin film transistor array panel of claim 7, wherein
    the first semiconductor and the discharge semiconductor are disposed in a same layer; and
    the first input electrode, the first output electrode, the discharge input electrode and the discharge output electrode are disposed in a same layer.

14. A method for manufacturing a thin film transistor array panel, comprising:
    forming a driving control electrode and a discharge control electrode on a substrate;
    forming a first insulating layer on the driving control electrode and the discharge control electrode;
    forming a driving semiconductor on the first insulating layer;
    forming a switching control electrode, a driving voltage line and a driving output electrode on the first gate insulating layer and the driving semiconductor by photolithography;
    forming a second insulating layer on the switching control electrode, the driving voltage line, the driving output electrode, and the first insulating layer;
    forming a switching semiconductor and a discharge semiconductor on the second insulating layer;
    forming a data line comprising a switching input electrode, a switching output electrode, a discharge input electrode and a discharge output electrode on the second insulating layer, the switching semiconductor and the discharge semiconductor;
    forming a pixel electrode connected to the driving output electrode;
    forming a light emitting member on the pixel electrode; and
    forming a common electrode on the light emitting member.

15. The method of claim 14, wherein
    the forming of the driving semiconductor comprises depositing a crystallized semiconductor.

16. The method of claim 14, wherein the forming of the driving semiconductor comprises:
    forming an amorphous semiconductor; and
    crystallizing the amorphous semiconductor.

* * * * *